(12) United States Patent
Tai

(10) Patent No.: US 6,903,597 B2
(45) Date of Patent: Jun. 7, 2005

(54) GATE DRIVING CIRCUIT

(75) Inventor: Hiromichi Tai, Saitama-ken (JP)

(73) Assignee: Toshiba Mitsubishi-Electric Industrial Systems Corporation, Tokyo (JP)

(*) Notice: Subject to any disclaimer, the term of this patent is extended or adjusted under 35 U.S.C. 154(b) by 0 days.

(21) Appl. No.: 10/757,573

(22) Filed: Jan. 15, 2004

(65) Prior Publication Data

US 2004/0145406 A1 Jul. 29, 2004

(30) Foreign Application Priority Data

Jan. 21, 2003 (JP) ........................................ 2003-012409

(51) Int. Cl.[7] .................................................. H03B 1/00
(52) U.S. Cl. ........................ 327/434; 327/432; 327/374; 327/108
(58) Field of Search ................................ 327/427, 419, 327/431–434, 478, 170, 108, 374, 376, 377; 326/82, 89

(56) References Cited

U.S. PATENT DOCUMENTS 6,054,890 A * 4/2000 Giacomo .................... 327/434
6,380,796 B2 * 4/2002 Sakai et al. ................. 327/434

FOREIGN PATENT DOCUMENTS

| JP | 6-291631 A | 10/1994 |
| JP | 2000-134075 A | 5/2000 |
| JP | 2001-274665 A | 10/2001 |

* cited by examiner

*Primary Examiner*—Long Nguyen
(74) *Attorney, Agent, or Firm*—Foley & Lardner LLP

(57) ABSTRACT

An object of the present invention is to provide a simple and easily adjustable gate driving circuit for an active gate drive. As a configuration for this, a gate driving circuit includes a delay control signal creation unit configured to create a delay control signal having a certain delay time with respect to a control signal given from a superior control device, a reference signal creation unit configured to create a voltage reference signal by waveform-shaping of the delay control signal, a voltage detector configured to detect a voltage between electrodes of a voltage-driven type switching element and output a principal voltage detection signal, and a comparator configured to compare the principal voltage detection signal with the voltage reference signal and output a comparison result signal which controls a current source.

8 Claims, 6 Drawing Sheets

GATE DRIVING CIRCUIT

CROSS-REFERENCE TO RELATED APPLICATIONS

This application is based upon and claims the benefit of priority from Japanese Patent Application No. 2003-012409 filed Jan. 21, 2003; the entire contents of which are incorporated herein by reference.

BACKGROUND OF THE INVENTION

1. Field of the Invention

The present invention relates to a gate driving circuit for driving a power switching element.

2. Description of the Related Art

Along with larger capacitance and a higher speed of a switching element, power inverters applying power switching elements have been steadily expanding their area of application. In particular, among these power switching elements, switching elements of metal-oxide semiconductor (MOS) gate types such as an insulated gate bipolar transistor (IGBT) and a metal-oxide semiconductor field-effect transistor (MOSFET) have recently been extending their field of application.

The IGBT and MOSFET are non-latching type switching elements that are not continuously in an on/off state on their own. When compared with latching type switching elements such as a thyristor, they are greatly advantageous in that delicate control from outside the switching element is available in switching transition periods of turning-on and turning-off.

In recent years, with respect to the IGBTs and the like, large-capacitance elements capable of enduring high voltages and large electric currents have entered the market, and the construction of self commutated inverters for electric power systems has been started using the IGBTs. In the inverters for electric power systems, rated voltages normally become extremely high to reduce loss during power transmission. Therefore, the inverters need to have a high voltage, for example, a direct current voltage of 50 kV, which is an even higher voltage.

To construct such high-voltage inverters, it is indispensable to serially connect a plurality of switching elements. In this case, a problem is variation in voltages in turn-on and off periods among the respective switching elements. This is because voltage allocations can be easily balanced when the switching elements are in a steady off state, however, in the transition periods, small variations in switching timings become a cause of greatly unbalanced voltage allocations, which lead to element destruction.

Moreover, even when the switching elements are not serially connected, switching loss of the elements is often becomes a problem. In particular, switching loss dramatically increases when a switching speed of the element is unavoidably reduced in consideration of electromagnetic interference against peripheral electronic equipment. Therefore, it becomes necessary to lower the rating of a device or to install a large cooling device to cool down the elements.

In contrast, for example, a technology described in Japanese Patent Laid-Open H6-291631 (hereinafter referred to as "Patent Document 1") has been known as a conventional driving circuit of a voltage-driven type element. In FIG. 1 and pages 3 to 4 of Patent Document 1, a driving circuit is disclosed, which includes: a circuit for applying, to a gate of a voltage-driven type element, a gate voltage through a second switch and a second resistor capable of varying a resistance value; a circuit for removing a gate voltage from the gate of the voltage-driven type element through a first switch and a first resistor capable of varying a resistance value; a voltage detector for detecting a principal voltage value of the voltage-driven type element and varying the resistance values of the first and second resistors in accordance with the detected voltage valve; and a control circuit for on and off controlling of the first and second switches.

Then, when the detected principal voltage is less than a predetermined value, the resistance values of the first and second resistors are changed to be low, and when the principal voltage is at the predetermined value or more, the resistance values are changed to be high. As a result, the resistance values of the first and second resistors change in accordance with changes in the principal voltage in the turn-off and turn-on periods of the voltage-driven type element, and a discharge or charge speed from gate capacitance changes accordingly. In other words, at the time of turning-off, the principal voltage increases, and therefore, the first resistor changes from low resistance to high resistance, which results in a slow-down in the discharge speed. On the other hand, at the time of turning-on, the principal voltage decreases, and therefore, the second resistor changes from high resistance to low resistance. Consequently, the charge speed is slow at first, and becomes higher from a period when the principal voltage is at the predetermined value or less.

This driving circuit suppresses a surge voltage and noises by relaxing a voltage change dv/dt and a current change di/dt during the turn-off and turn-on periods.

Moreover, a technology described in Japanese Patent Laid-Open 2001-274665 (hereinafter referred to as "Patent Document 2") has been known as a conventional driving circuit of a voltage-driven type element. In FIGS. 1 to 3 and pages 4 to 7 of Patent Document 2, a driving circuit is configured to apply a gate voltage from a second switch controlled by a second control circuit through a second resistor to a gate of a voltage-driven type element. Further, a first resistor connected to a first switch controlled by a first control circuit is connected in parallel with the second resistor. Moreover, a voltage detector for detecting a principal voltage value of the voltage-driven type element and a current detector for detecting a principal current value flowing in the voltage-driven type element are provided. The first control circuit includes a delay circuit for setting a delay time corresponding to the principal current value and turns on the first switch based on an on/off control signal against the second switch of the second control circuit. Meanwhile, after the principal voltage value detected in the voltage detector reaches a predetermined value, the first control circuit turns off the first switch after the delay time set by the delay circuit in accordance with the principal current value detected by the current detector.

Then, immediately after the turn-on/turn-off of the voltage driven type element, fast charge/discharge is performed against gate capacitance while maintaining a changing speed of a gate voltage at a high level using a low resistance value attributable to a parallel connection of the first and the second resistors. Thereafter, the first switch is turned off at timings according to a terminal voltage value and the principal current value, and the changing speed of the gate voltage is relaxed using a high resistance value only of the second control circuit, thereby preventing a surge voltage from increasing. In other words, mainly by changing the charge/discharge speed against the gate capacitance in the turn-on and turn-off periods, the increase in the surge voltage is prevented.

Furthermore, a technology described in Japanese Patent Laid-Open 2000-134075 (hereinafter referred to as "Patent Document 3") has been known as a conventional driving circuit of a switching element. In FIG. 1 and the pages 2 to 3 of Patent Document 3, a driving circuit is disclosed, which includes: a circuit for voltage-driving a switching element such that a maximum value of a relative voltage change of a drive waveform driving the switching element is set to be at a predetermined value or less; and a circuit for applying negative feedback to the switching element.

In general, operational characteristics of a switching element change nonlinearly to a drive waveform, and even when a maximum value of a relative voltage change of the drive waveform is at a predetermined value or less, the relative voltage change of an output waveform is at a predetermined value or more. Therefore, even when only the drive waveform is blunted, a surge current and a surge voltage cannot be suppressed to be predetermined values or less. Hence, in this driving circuit, negative feedback is further applied, and a switching speed is slowed down within a range meeting a specification of a device or a circuit to suppress occurrence of a surge current and a surge voltage within rating.

Furthermore, an active gate drive technology has been recently used. Here, high controllability, which is a feature of the non-latching type switching element, is utilized to delicately adjust a gate voltage of the element in accordance with a collector-emitter voltage and the like at a time of switching transition. This technology thus suppresses a turn-off surge voltage and a turn-on surge current and evenly allocates voltages among the serially connected switching elements.

FIG. 1 shows a block diagram of a driving circuit that enables active gate drive. An active gate drive technology is a very effective technology for reducing main circuit parts and realizing a highly reliable inverter. However, on the other hand, there is a problem that, since a gate driving circuit becomes complicated, adjustment thereof becomes difficult. This will be explained hereinbelow using FIG. 1.

In FIG. 1, a control electrode of a switching element 9 is driven by a voltage source 2 through a resistor 8. The voltage source 2 generates a square-shaped voltage waveform in response to a gate signal supplied from a voltage source controller 1. Meanwhile, to the control electrode of the switching element 9, a current source 6 is also connected. A dv/dt detector 12 detects whether dv/dt, which is a time derivative value of a principal voltage of the switching element 9, is large or small, and a surge voltage detector 11 detects a surge voltage of the principal voltage. The current source 6 reduces the surge voltage based on outputs from these detectors, and adjusts a gate voltage of the switching element 9 to adjust a switching speed to be a desired dv/dt in accordance with a current control signal created by a current source controller 10. Thus, the principal voltage of the switching element 9 rises/falls at an appropriate dv/dt at a time of switching transition, and the surge voltage that can cause element destruction can be suppressed.

However, in the technology described in Patent Document 1, the voltage change dv/dt and the current change di/dt during the turn-off and turn-on periods are relaxed to suppress the surge voltage and noises. Therefore, there is a possibility that a high-speed switching characteristic of the voltage-driven type element is damaged to cause an increase in switching loss.

In the technology described in Patent Document 2, the increase in the surge voltage is prevented mainly by relaxing the charge/discharge speed against the gate capacitance in the turn-on and turn-off periods. Therefore, similar to the above, there is a possibility that a high-speed switching characteristic of the voltage-driven type element is damaged to cause an increase in switching-loss.

In the technology described in Patent Document 3, the occurrence of the surge current and surge voltage is suppressed by applying the negative feedback to the switching element to slow down the switching speed. Therefore, there is a possibility that an increase in switching loss is caused.

Moreover, in the active gate drive technology shown in FIG. 1, there are still some problems. First, feedback control loops are made up of two systems including the surge voltage and dv/dt, and an operation thereof may become unstable because these systems mutually interfere. To avoid this, it is necessary to adjust the gain of the two loops. However, since the loops are control loops operating only at the time of switching transition, the adjustment thereof is not easy.

Second, the technology shown in FIG. 1 is satisfactory in terms of the turn-off side. However, it is not easy to deal with the turn-on side. An only way for controlling dv/dt to reduce stress at a time of reverse recovery of a pair of FWDs also on the turn-on side is to provide another control loop. Thus, there is a problem with the technology shown in FIG. 1 in that adjustment is difficult and flexibility is lacking.

The present invention is made in consideration of the above. An object thereof is to provide a gate driving circuit for active gate drive which is simple and easily adjusted and capable of suppressing occurrence of a surge current and a surge voltage for certain without causing an increase in switching loss.

SUMMARY OF THE INVENTION

A first gate driving circuit of the present invention includes: a voltage source and a current source which drive a control electrode of a voltage-driven type switching element; a voltage source controller configured to create a voltage drive signal which controls the voltage source using a control signal given from the outside; a delay control signal creation unit configured to create a delay control signal having a certain delay time with respect to the control signal; a reference signal creation unit configured to create a voltage reference signal by waveform shaping of the delay control signal; a voltage detector configured to detect a voltage between main electrodes of the voltage-driven type switching element and output a principal voltage detection signal; and a comparator configured to compare the principal voltage detection signal with the voltage reference signal and output a comparison result signal which controls the current source.

In the present invention, the voltage reference signal is created by waveform-shaping of the delay control signal delayed for a certain period with respect to the control signal given from outside, and the principal voltage detection signal of the switching element is detected by the voltage detector. The principal voltage detection signal and the voltage reference signal are compared with each other in the comparator, and the current source is controlled by the comparison result signal, thereby active gate drive is performed.

In other words, a feedback control loop is only one single loop that detects the principal voltage of the switching element, in which loop the active gate drive is performed.

Moreover, even in any of the turn-on and turn-off switching transition periods, the active gate drive is performed in this single loop.

Thus, this gate driving circuit is simply configured and easily adjusted, and, as for suppression of a surge current and a surge voltage, since a charge/discharge speed with respect to gate capacitance in the turn-on and turn-off periods is not relaxed, switching loss does not increase.

A second gate driving circuit of the present invention includes: a voltage source and a current source which drive a control electrode of a voltage-driven type switching element; a voltage source controller configured to create a voltage drive signal which controls the voltage source using a control signal given from the outside; a delay control signal creation unit configured to create a delay control signal having a certain delay time with respect to the control signal; a reference signal creation unit configured to create a voltage reference signal by waveform shaping of the delay control signal; a voltage detector configured to detect a voltage between main electrodes of the voltage-driven type switching element and output a principal voltage detection signal; a comparator configured to compare the principal voltage detection signal with the voltage reference signal and output a comparison result signal which controls the current source; a transition period detector configured to detect a switching transition period by using the control signal; and a selective signal pass-through unit for allowing the comparison result signal to pass through only in the switching transition period and attenuating the comparison result signal in a steady period, the selective signal pass-through unit being connected to a next stage of the comparator.

Active gate drive is effective mainly in the switching transition period, and in a steady state, a potential of the control electrode of the switching element is preferably in a fixed state.

Therefore, in the present invention, by the selective signal pass-through unit, the comparison result signal is passed-through only in the switching transition period, while the comparison result signal is attenuated in the steady state. Thus, the control electrode potential of the switching element is fixed at a value determined by the voltage source in the steady state after the switching transition period has ended.

In a third gate driving circuit of the present invention, an output terminal of the voltage source is connected to the control electrode of the voltage-driven type switching element through a resistor, and an output terminal of the current source is connected to the control electrode of the voltage-driven type switching element.

When the control electrode of the switching element is voltage-driven through the resistor, a response from the switching element is delayed for a time width of a Miller period. This time width is determined in accordance with a value of the resistor and characteristics of a gate (control electrode) of the switching element.

Therefore, in the present invention, when creating the voltage reference signal in the reference signal creation unit, by using a delay control signal having a delay time in accordance with the value of the resistor, active gate drive is performed at an appropriate timing.

In a fourth gate driving circuit of the present invention, in the delay control signal creation unit, the delay time of the delay control signal is variably set in accordance with a value of the resistor.

The value of the resistor connected to the control electrode of the voltage-driven type switching element is often changed in accordance with a situation.

Therefore, in the present invention, by variably setting the delay time of the -delay control signal in accordance with the resistor value, active gate drive is always performed at an appropriate timing. Thus, occurrence of a surge current and a surge voltage can be suppressed without fail.

In a fifth gate driving circuit of the present invention, in the reference signal creation unit, a two-dimensional type low-pass filter is used.

The voltage reference signal can be created by the reference signal creation unit using a two-dimensional type low-pass filter that is made up of a series circuit composed of a resistor, an inductance and a capacitance.

The present invention allows, by configuring the reference signal creation unit in such a manner, the gate driving circuit to have a simpler configuration.

DESCRIPTION OF THE EMBODIMENTS

First Embodiment

Figure 2:
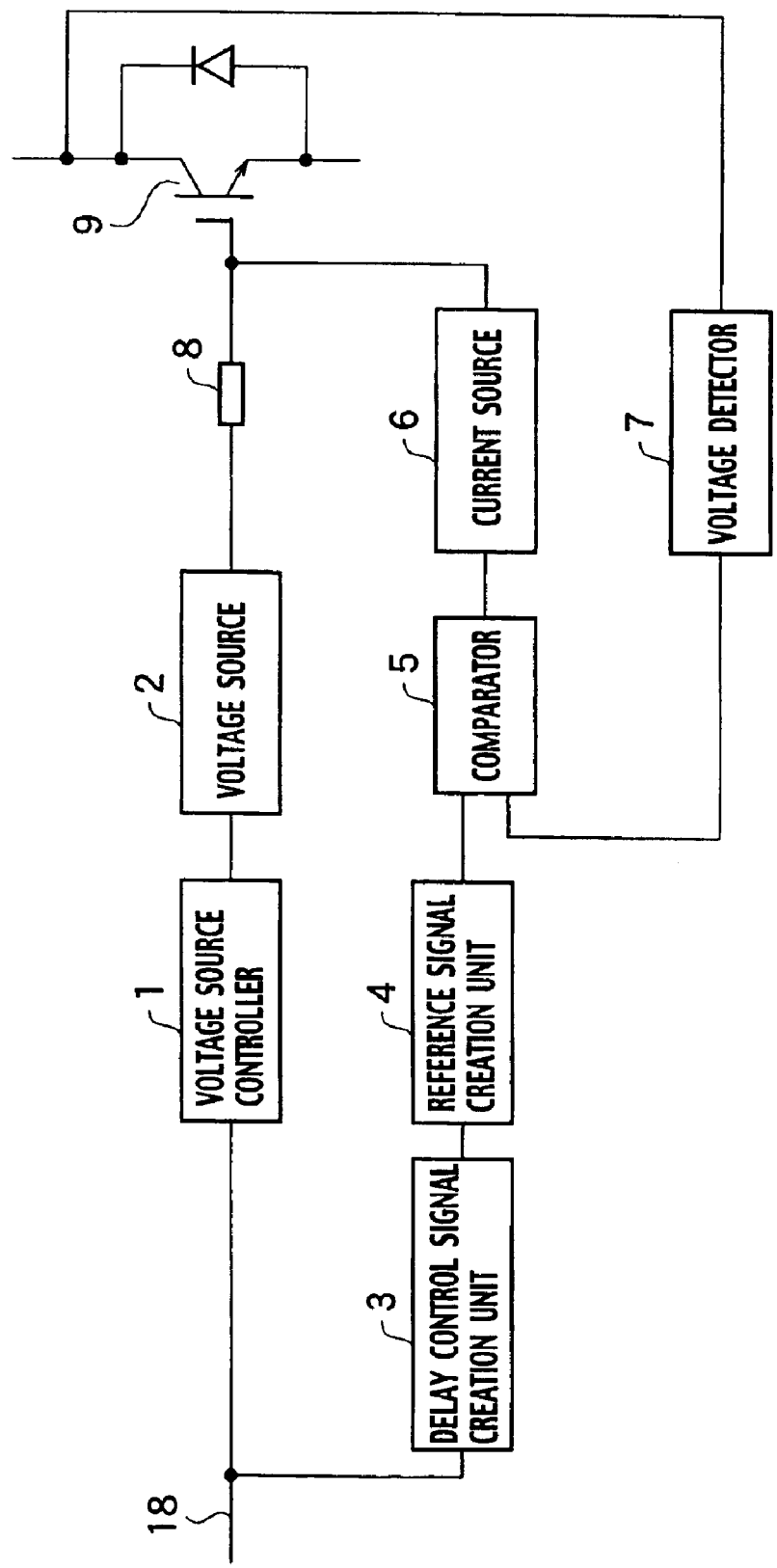
FIG. 2 shows a block diagram of a gate driving circuit of a first embodiment.

FIG. 2 is a block diagram showing a configuration of a gate driving circuit of a first embodiment. First, the configuration of this gate driving circuit will be described. In FIG. 2, a portion where a control signal of a current source 6 is created is configured as follows.

Figure 1:
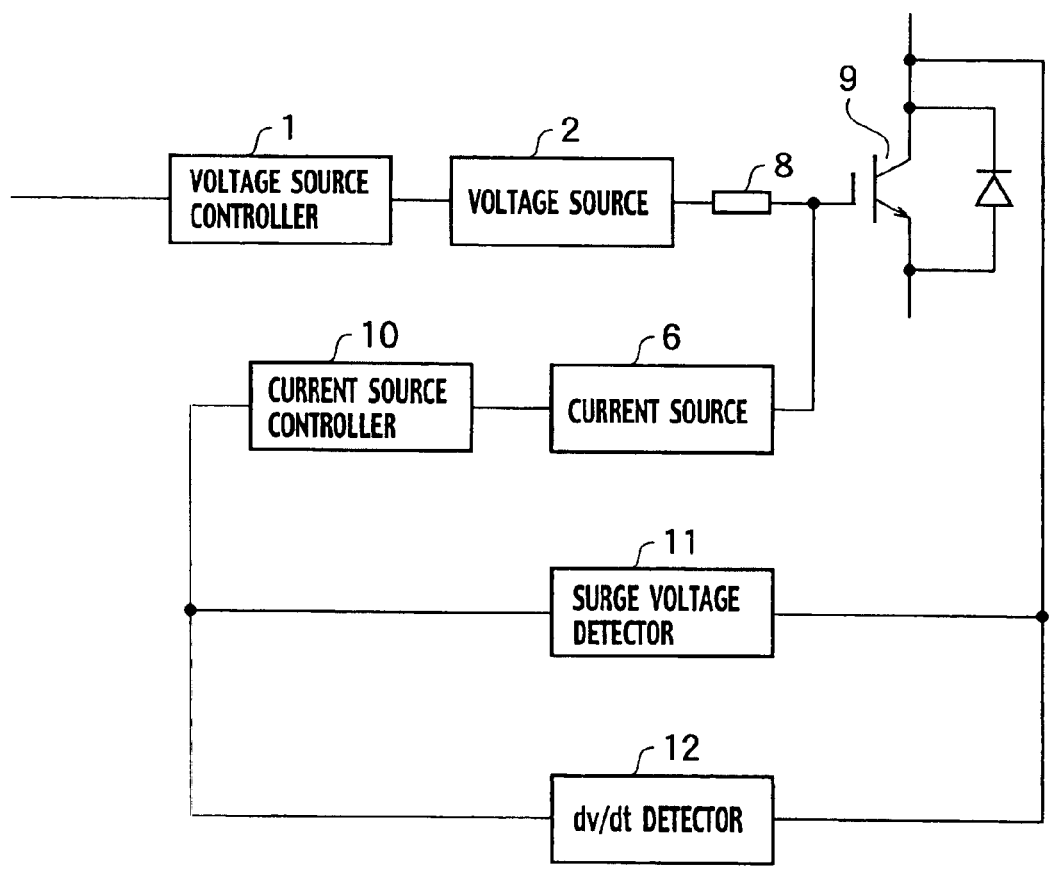
FIG. 1 shows a block diagram of a gate driving circuit of a related art.

A control signal given from an external superior control device, which is omitted in the drawing, through a signal line 18 is inputted to a delay control signal creation unit 3. The delay control signal creation unit 3 creates, with respect to the inputted control signal, a delay control signal that is delayed for a certain period corresponding to a time width of a later-described Miller period. This delay control signal is inputted to a reference signal creation unit 4. The reference signal creation unit 4 performs waveform shaping on the inputted delay control signal to create a voltage reference signal, and this voltage reference signal is inputted to one of input terminals of a comparator 5. Further, an output of a principal voltage detection signal from a voltage detector 7, which detects a voltage between main electrodes (between a collector and an emitter) of a voltage-driven type switching element 9, is inputted to the other input terminal of the comparator 5. The comparator 5 compares the principal voltage detection signal with the voltage reference signal to output a comparison result signal, and controls a current source 6 through the comparison result signal. A gate electrode (control electrode) of the switching element 9 is current-driven by an output from the current source 6 thus controlled. Note that, in FIG. 2 and in drawings showing respective embodiments described later, same and equivalent constituents as those in FIG. 1 will be denoted by the same numerals as above, and overlapping explanation will be omitted.

Next, an operation of this gate driving circuit configured as described above will be explained. The gate electrode of the switching element 9 is voltage-driven by a square wave-shaped gate voltage provided from the voltage source 2 through a resistor 8. Moreover, at the same time as this, as for the gate electrode of the switching element 9, active gate drive to suppress a turn-off surge voltage and a turn-on surge current in switching transition periods is performed.

Specifically, the principal voltage of the switching element 9 is detected by the voltage detector 7 and made into the principal voltage detection signal on an appropriate voltage level, and then compared, by the comparator 5, with the voltage reference signal created by the reference signal creation unit 4. The gate electrode of the switching element 9 is current-driven by the output from the current source 6 that is controlled by the comparison result signal. A waveform of the principal voltage of the switching element 9 is thus controlled to approximate the voltage reference signal, whereby the active gate drive is performed. Thus, a feedback control loop is only one single loop that detects the principal voltage of the switching element 9, in which loop the active gate drive is performed. Moreover, even in any of the turn-on and turn-off switching transition periods, the active gate drive is performed in this single loop.

As described above, according to the present embodiment, the current-driven feedback loop operating in the switching transition periods is made up of the single loop that detects the principal voltage of the switching element 9, and therefore, problems due to mutual interference are not caused. In addition, in both the turn-on and turn-off switching transition periods, the single voltage reference signal can be used in the single control loop. Thus the configuration becomes simple and adjustment is facilitated, accordingly.

Second Embodiment

Figure 3:
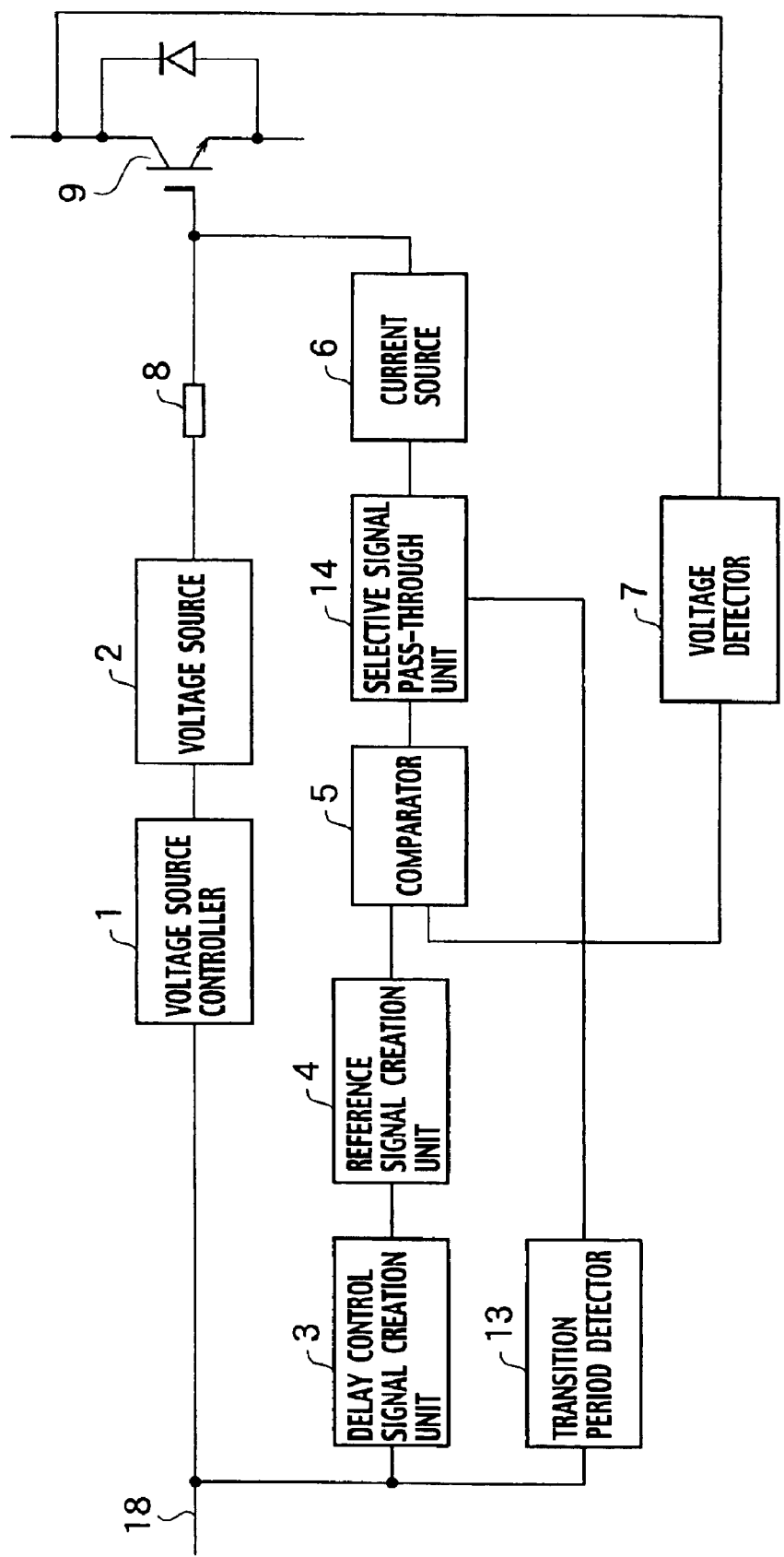
FIG. 3 shows a block diagram of a gate driving circuit of a second embodiment.

FIG. 3 is a block diagram showing a gate driving circuit of a second embodiment. Current drive by the current source 6 is effective mainly at a time of switching transition. In steady states such as an on-state and an off-state, it is desirable to fix a gate potential of the switching element 9. Therefore, it is more preferable that the current source 6 does not operate in the steady states. The gate driving circuit of this embodiment is one that meets such requirements.

In this gate driving circuit shown in FIG. 3, there is provided a transition period detector 13 that detects switching transition periods by using control signals given from an external superior control device. A selective signal pass-through unit 14, which allows the comparison result signals to pass through only in the switching transition periods detected by the transition period detector 13 and attenuates the comparison result signals in the steady periods, is connected to the next stage of the comparator 5. Thus, the transition period detector 13 and the selective signal pass-through unit 14 are newly added. As for other constituents, the same ones as in FIG. 2 are denoted by the same numerals, and overlapping explanation will be omitted.

The transition period detector 13 detects the switching transition periods by using the control signals, and the signal is allowed to pass through the selective signal pass-through unit 14 only in the transition periods, whereby the comparison result signals are inputted to the current source 6. Due to this configuration, in the steady states after the switching transition periods have ended, the comparison result signals are not applied to the current source 6, and the gate potential of the switching element 9 is fixed at a voltage value determined by the voltage source 2.

An analog switch composed of complementary metal-oxide semiconductor integrated circuits (CMOS-ICs) can be used as the selective signal pass-through unit 14, for example. Alternatively, a variable amplifier, which can electrically vary voltage gain, or the like can be used.

In FIGS. 2 and 3, the delay control signal delayed for a certain period is used to create the voltage reference signal in the reference signal creation unit 4 for the following reasons. Equivalent input capacitance when the gate as the control electrode of the MOS gate-type switching element is seen from outside greatly varies in accordance with the principal voltage of the switching element. This is because non-linear electrostatic capacitance seems to equivalently exist between an output terminal and a gate terminal due to feedback capacitance existing inside the switching element.

Figure 4:
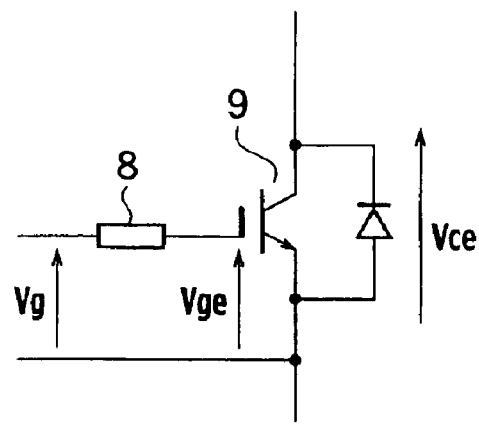
FIG. 4 shows a diagram defining voltages of respective units in a vicinity of a voltage-driven type switching element.
Figure 5:
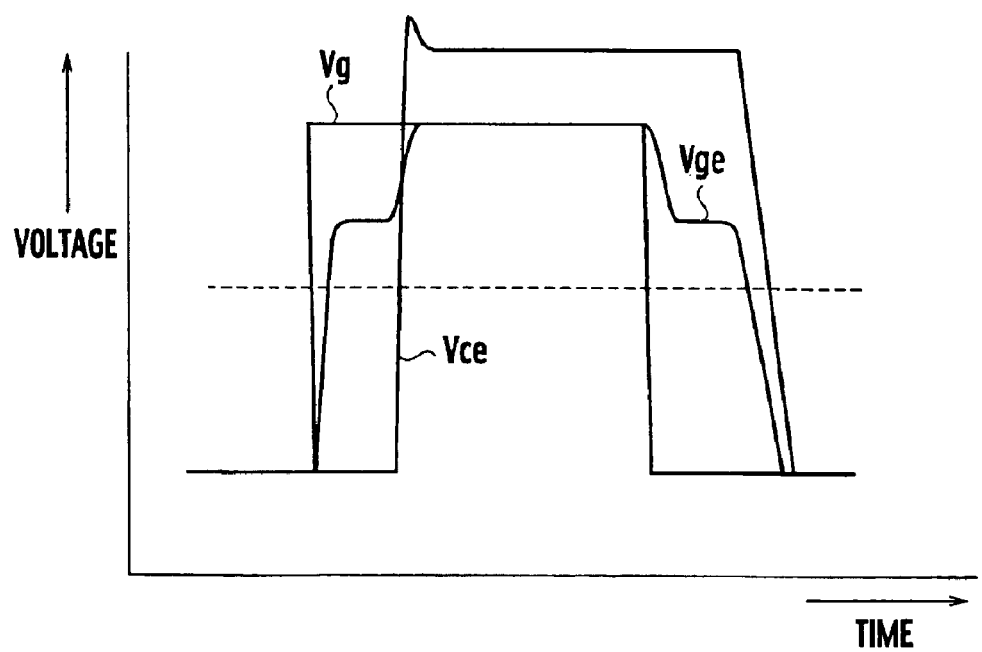
FIG. 5 shows voltage waveforms of the respective units in the vicinity of the voltage-driven type switching element.

Therefore, as shown in FIG. 4, if the gate is voltage-driven through the resistor 8, even when a square wave voltage is applied as a gate drive voltage Vg, a gate-emitter voltage Vge does not immediately follow the gate drive voltage Vg. Instead, as shown in FIG. 5, the gate-emitter voltage Vge once stays at an intermediate potential (Miller potential) for a while, and rises or falls thereafter. A period when Vge stays at the Miller potential is called a Miller period. As soon as the Miller period ends, the principal voltage Vce of the switching element 9 starts rising or falling.

In this way, a response from the switching element 9 is delayed for approximately a time width of the Miller period with respect to a gate drive signal. This time width is determined in accordance with a value of the resistor 8 and gate characteristics of the switching element 9. Therefore, as long as the same switching element 9 is used, a response delay of the switching element 9 is determined when the value of the resistor 8 is determined.

When creating the reference signal of the principal voltage of the switching element 9, this response delay time of the switching element needs to be considered. If the voltage reference signal is created in disregard of the response delay, the response of the switching element cannot catch up, and thus appropriate control cannot be performed. In the first and second embodiments, the delay control signal delayed for a certain period is used when creating the voltage reference signal.

Third Embodiment

Figure 6:
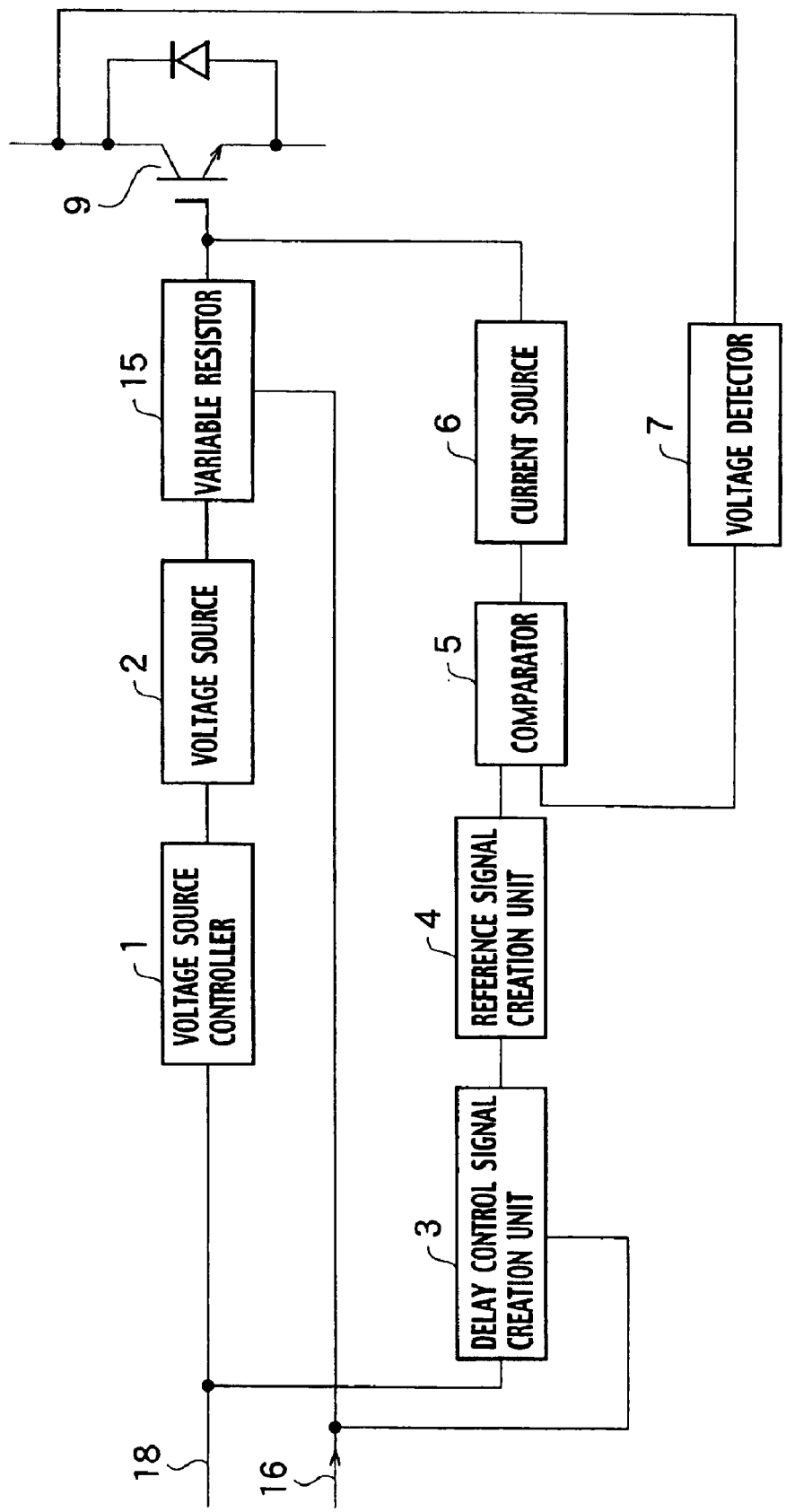
FIG. 6 shows a block diagram of a gate driving circuit of a third embodiment.

FIG. 6 shows a block diagram of a gate driving circuit of a third embodiment. A value of the resistor 8 connected to the gate electrode of the switching element 9 is often changed in accordance with a situation. In this case, it is appropriate that the delay time width of the voltage reference signal created by the reference signal creation unit 4 is also changed in response to the above. The gate driving circuit of this embodiment is one that responds to this.

In the gate driving circuit of this embodiment, in FIG. 6, a variable resistor 15 is used instead of the resistor 8. The variable resistor 15 changes its value in accordance with a gate resistance value setting signal 16 and can vary the Miller period. Moreover, the gate resistance value setting signal 16 is inputted also to the delay control signal creation unit 3, and the delay time of the delay control signal is changed in response to the changed Miller period. The delay time width of the voltage reference signal created in the reference signal creation unit 4 is then changed. In this way, the voltage reference signal having an appropriate delay time width can always be inputted to the comparator 5. As for other constituents, the same ones as in FIG. 2 are denoted by the same numerals, and overlapping explanation will be omitted.

Fourth Embodiment

Figure 7:
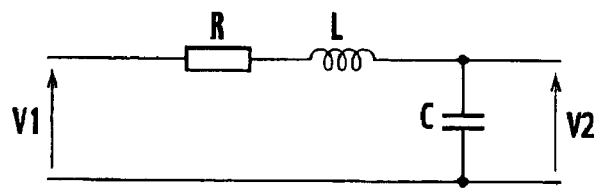
FIG. 7 shows a block diagram of a reference signal creation unit in a gate driving circuit of a fourth embodiment.

FIG. 7 shows a circuit of a reference signal creation unit in a gate driving circuit of a fourth embodiment. As has been described above, in each of the foregoing gate driving circuit, the voltage reference signal having a preferable waveform as a reference waveform of the principal voltage of the switching element 9 is created in the reference signal creation unit 4 inside the gate driving circuit, and, based on this, the switching element 9 is controlled. A simple and highly reliable circuit unit is desired as a creation unit for the voltage reference signal.

First, it is considered what kind of waveform the principal voltage itself usually becomes. For the principal voltage, three components including an inductance portion contained in a main circuit, a capacitance portion of the switching element itself and a snubber capacitor, and various resistance portions can be considered.

Figure 8:
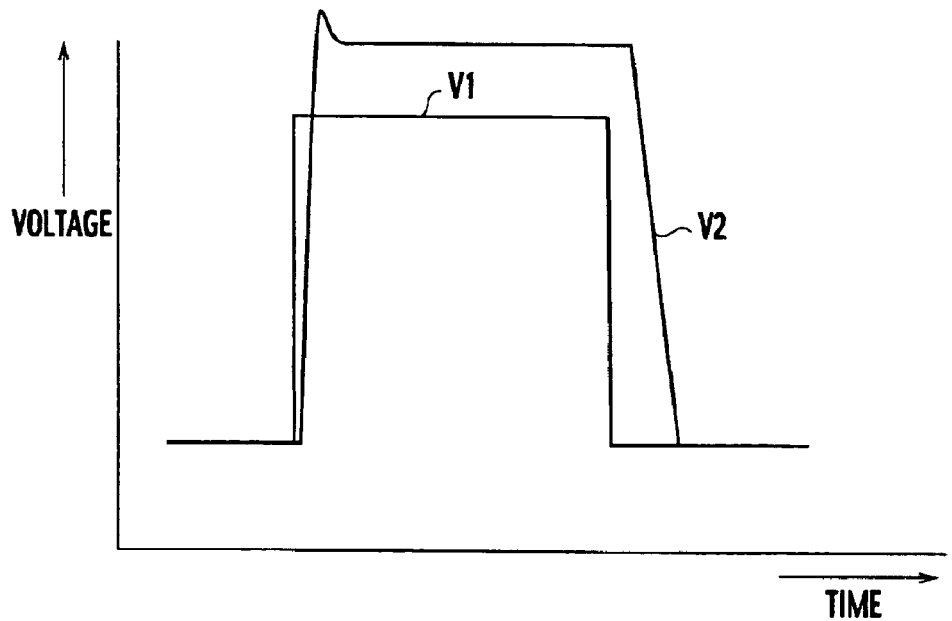
FIG. 8 shows voltage input and output waveforms of the reference signal creation unit.

The above three components as well as behavior of the switching element itself define a switching waveform. If simplified most, the circuit unit becomes a simple series circuit with a resistor R, an inductance L and a capacitance C. When it is considered that the element can generally approximate itself as a capacitance during an off period, a voltage of the switching element itself is a voltage across the capacitor. Thus, in FIG. 7, the voltage of the switching element can be approximated through an output voltage V2 when a square wave is added as V1. FIG. 8 shows waveforms of the input voltage V1 and output voltage V2.

The circuit in FIG. 7 is nothing but basically a second order low-pass filter. Therefore, as a simplest reference signal creation unit, a second order low-pass filter is preferable.

Note that, although the circuit in FIG. 7 is a circuit using the inductance L, capacitance C and resistance R, it goes without saying that a low pass filter using an operational amplifier can be used.

What is claimed is:

1. A gate driving circuit, comprising:

a voltage source and a current source which drive a control electrode of a voltage-driven type switching element;

a voltage source controller configured to create a voltage drive signal which controls the voltage source using a control signal given from the outside;

a delay control signal creation unit configured to create a delay control signal having a certain delay time with respect to the control signal;

a reference signal creation unit configured to create a voltage reference signal by waveform shaping of the delay control signal;

a voltage detector configured to detect a voltage at a main electrode of the voltage-driven type switching element and output a principal voltage detection signal; and a comparator configured to compare the principal voltage detection signal with the voltage reference signal and output a comparison result signal which controls the current source.

2. A gate driving circuit, comprising:

a voltage source and a current source which drive a control electrode of a voltage-driven type switching element;

a voltage source controller configured to create a voltage drive signal which controls the voltage source using a control signal given from the outside;

a delay control signal creation unit configured to create a delay control signal having a certain delay time with respect to the control signal;

a reference signal creation unit configured to create a voltage reference signal by waveform shaping of the delay control signal;

a voltage detector configured to detect a voltage at a main electrode of the voltage-driven type switching element and output a principal voltage detection signal;

a comparator configured to compare the principal voltage detection signal with the voltage reference signal and output a comparison result signal which controls the current source;

a transition period detector configured to detect a switching transition period of the voltage-driven type switching element by using the control signal; and a selective signal pass-through unit for allowing the comparison result signal to pass through only in the switching transition period of the voltage-driven type switching element and attenuating the comparison result signal in a steady period of the voltage-driven type switching element, the selective signal pass-through unit being connected to an output of the comparator.

3. The gate driving circuit of claim 1, wherein an output terminal of the voltage source is connected to the control electrode of the voltage-driven type switching element through a resistor, and an output terminal of the current source is connected to the control electrode of the voltage-driven type switching element.

4. The gate driving circuit of claim 3, wherein, in the delay control signal creation unit, the delay time of the delay control signal is variably set in accordance with a value of the resistor.

5. The gate driving circuit of claim 1, wherein, in the reference signal creation unit, a second order low-pass filter is used.

6. The gate driving circuit of claim 2, wherein an output terminal of the voltage source is connected to the control electrode of the voltage-driven type switching element through a resistor, and an output terminal of the current source is connected to the control electrode of the voltage-driven type switching element.

7. The gate driving circuit of claim 2, wherein, in the reference signal creation unit, a second order low-pass filter is used.

8. The gate driving circuit of claim 6, wherein, in the delay control signal creation unit, the delay time of the delay control signal is variably set in accordance with a value of the resistor.

* * * * *